United States Patent
Hwang et al.

(10) Patent No.: US 9,202,904 B2
(45) Date of Patent: Dec. 1, 2015

(54) POWER DEVICE CHIP AND METHOD OF MANUFACTURING THE POWER DEVICE CHIP

(71) Applicant: Samsung Electronics Co., Ltd., Suwon-Si, Gyeonggi-Do (KR)

(72) Inventors: In-jun Hwang, Hwaseong-si (KR); Jong-seob Kim, Seoul (KR); Jae-joon Oh, Seongnam-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 14/224,769

(22) Filed: Mar. 25, 2014

(65) Prior Publication Data

US 2014/0291728 A1  Oct. 2, 2014

(30) Foreign Application Priority Data

Mar. 27, 2013  (KR) .................. 10-2013-0033089

(51) Int. Cl.
*H01L 29/66* (2006.01)
*H01L 29/778* (2006.01)
*H01L 29/16* (2006.01)
*H01L 29/40* (2006.01)

(52) U.S. Cl.
CPC .......... *H01L 29/778* (2013.01); *H01L 29/7787* (2013.01); *H01L 29/1608* (2013.01); *H01L 29/402* (2013.01)

(58) Field of Classification Search
CPC ............ H01L 29/1608; H01L 29/2003; H01L 29/402; H01L 29/41758; H01L 29/42316; H01L 29/772; H01L 29/778; H01L 29/7787; H01L 29/78

USPC ............ 257/194, 76, 226, 256, 392, 77, 288, 257/192; 330/307, 295; 438/6, 605

See application file for complete search history.

(56) References Cited

U.S. PATENT DOCUMENTS

| 6,530,068 | B1 | 3/2003 | Cao et al. |
| 6,809,348 | B1 | 10/2004 | Suzuki et al. |
| 8,194,490 | B2 | 6/2012 | Chen et al. |
| 2003/0006847 | A1* | 1/2003 | Nelson ............ 330/307 |
| 2009/0079439 | A1 | 3/2009 | Kuo |
| 2012/0012858 | A1* | 1/2012 | Inoue ............. 257/76 |
| 2013/0228788 | A1* | 9/2013 | Yamamura ........... 257/76 |

FOREIGN PATENT DOCUMENTS

| JP | 2008-097541 A | 4/2008 |
| KR | 10-0390939 B1 | 7/2003 |

\* cited by examiner

*Primary Examiner* — Mohammed Shamsuzzaman
(74) *Attorney, Agent, or Firm* — Harness, Dickey & Pierce, P.L.C.

(57) ABSTRACT

According to example embodiments, a power device chip includes a plurality of unit power devices classified into a plurality of sectors, a first pad and a second pad. At least one of the first and second pads is divided into a number of pad parts equal to a number of the plurality of sectors. The first pad is connected to first electrodes of the plurality of unit power devices, and the second pad is connected to second electrodes of the plurality of unit power devices. The unit power devices may be diodes. The power device chip may further include third electrodes in the plurality of unit power devices, and a third pad may be connected to the third electrodes. In this case, the unit power devices may be high electron mobility transistors (HEMTs). Pad parts connected to defective sectors may be excluded from bonding.

20 Claims, 10 Drawing Sheets

POWER DEVICE CHIP AND METHOD OF MANUFACTURING THE POWER DEVICE CHIP

CROSS-REFERENCE TO RELATED APPLICATIONS

This application claims the priority of Korean Patent Application No. 10-2013-0033089, filed on Mar. 27, 2013, in the Korean Intellectual Property Office, the disclosure of which is incorporated herein in its entirety by reference.

BACKGROUND

1. Field

Example embodiments relate to a power device, and more particularly, to a power device chip including a plurality of unit devices divided into sectors and/or a method of manufacturing the power device chip.

2. Description of the Related Art

The chip size of a power device may be proportional to a current flowing in the power device. When a power device is designed for a large current, the chip size of the power device may be increased to handle the large current. For example, a chip having a size of 100 mm$^2$ may be used to obtain a power device in which a current of 100 A or more flows. When a current is less than 100 A, the chip size of a power device may be smaller than 100 mm$^2$.

Wafers used to manufacture semiconductor devices, such as power devices, may have defects for several reasons. Therefore, as the wafer defects decrease, the yield of the semiconductor device may increase.

However, it is practically and technically difficult to completely remove wafer defects. If the wafer defects are managed to an appropriate level, the yield of a semiconductor device using the wafer may increase with a decrease in the chip size of the semiconductor device.

Such a fact may also be applied to power devices. However, since power devices are used in high-voltage and/or large-current environments as described above, it may be difficult to reduce their chip sizes, unlike general semiconductor memory devices.

If a power device is manufactured using an 8-inch wafer and the chip size of the power device is 100 mm$^2$, it is known that, when the wafer has no more than 100 defects, a yield of about 73% may be secured.

To improve the yield of power devices, at present, a source finger, a drain finger, and a gate finger of a broken-down part of a chip may be cut out, and the other parts may be used. In this yield-improvement, a process of searching for the broken-down part is preceded. However, it is not easy to find the broken-down part. In addition, since a thick metal and a thick dielectric may be used to deal with a large current, cutting the thick metal and the thick dielectric may be difficult. Therefore, it may be difficult to uniformly cut broken-down parts out of a chip; consequently, the remaining part may be vulnerable to a high voltage.

SUMMARY

Example embodiments relate to power device chips including a plurality of unit devices divided into sectors.

Example embodiments also relate methods of manufacturing power device chips.

Additional aspects will be set forth in part in the description which follows and, in part, will be apparent from the description, or may be learned by practice of example embodiments.

According to example embodiments, a power device chip includes a plurality of unit power devices classified into a plurality of sectors; a first pad; and a second pad. At least one of the first and second pads is divided into a number of pad parts equal to a number of the plurality of sectors. The first pad is connected to first electrodes of the plurality of unit power devices. The second pad is connected to second electrodes of the plurality of unit power devices.

In example embodiments, the unit power devices may be diodes.

In example embodiments, the power device chip may further include third electrodes in the plurality of unit power devices, and a third pad connected to the third electrodes. In this case, the unit power devices may be high electron mobility transistors (HEMTs).

In example embodiments, the first electrodes may be source electrodes, the third electrodes may be gate electrodes, and the gate electrodes may include first and second gate electrodes respectively arranged adjacent to opposite sides the source electrodes.

In example embodiments, the first, second, and third pads may be arranged beside or above the plurality of unit power devices.

In example embodiments, the first pad may be a source pad, and the source pad may include: source electrode pads that contact the first electrodes, and source contact pads connected to the source electrode pads.

In example embodiments, the second pad may be a drain pad, and the drain pad may include: drain electrode pads that contact the second electrodes, and drain contact pads connected to the drain electrode pads.

In example embodiments, the first and second pads may be arranged beside or above the plurality of unit power devices.

According to example embodiments, a method of manufacturing a power device chip includes: forming a plurality of unit power devices on a substrate, each of the plurality of unit power devices including at least a first electrode and a second electrode; classifying the plurality of unit power devices into a plurality of sectors; forming a first pad connected to the first electrodes of the plurality of unit power devices; forming a second pad connected to the second electrodes of the plurality of unit power devices; and dividing at least one of the first and second pads into a number of pad parts equal to a number of the plurality of sectors.

In example embodiments, the unit power devices may be diodes.

In example embodiments, the method may further include: forming third electrodes in the plurality of unit power devices; and forming a third pad connected to the third electrodes. In this case, the unit power devices may be HEMTs.

In example embodiments, the forming the first, second, and third pads may include forming the first, second, and third pads beside or above the plurality of unit power devices. At least one of the first pad, the second pad, and third pad may be formed on the other side of the plurality of unit power devices.

In example embodiments, the first pad may be a source pad, and the forming of the first pad may include: forming source electrode pads that cover the first electrodes, and forming source contact pads connected to the source electrode pads. In this case, the source electrode pads and the source contact pads may be formed simultaneously.

In example embodiments, the second pad may be a drain pad, and the forming of the second pad may include: forming drain electrode pads that cover the second electrodes, and forming drain contact pads connected to the drain electrode pads. In this case, the drain electrode pads and the drain contact pads may be formed simultaneously.

In example embodiments, the first electrodes may be source electrodes, the third electrodes may be gate electrodes, and the forming of the third electrodes may include forming first and second gate electrodes respectively arranged adjacent to opposite sides of the source electrodes.

In example embodiments, the first and second pads may be formed beside or above the plurality of unit power devices. Either the first pads or the second pads may be formed on the other side of the plurality of unit power devices.

In example embodiments, the classifying of the plurality of unit power devices into the plurality of sectors may include defining sectors so a number of the plurality of unit power devices in each sector is identical.

The classifying of the plurality of unit power devices into the plurality of sectors may include classifying the plurality of unit power devices into a number of sectors that is greater in number than the number of sectors that is determined when there are no wafer defects.

In example embodiments, the method may further include: detecting defective sectors from the plurality of sectors by measuring a breakdown voltage between the first and second pads; and performing bonding on pad parts that remain after excluding pad parts connected to the defective sectors from the pad parts into which at least one of the first and second pads is divided.

In a power device chip according to example embodiments, a plurality of unit devices may be classified into a plurality of sectors, a defective sector, for example, a sector having a breakdown voltage (BV) smaller than a desired (and/or alternatively predetermined) value, may be excluded from wire bonding, and wire bonding may be performed on an extra sector that is to replace the defective sector. To this end, at least a drain pad may be divided into the same number of pad parts as the number of sectors. According to this method, the yield of the power device chip may be increased, and a cutting process for removing a defective part from the power device chip may not be required. Moreover, since a BV is measured for each sector, a defective part may be easily detected.

According to example embodiments, a power device chip includes: an active region of a plurality of unit power devices, the plurality of unit power devices including first and second electrodes spaced apart from each other on the active region; and first and second pad structures defining sectors of the active region. Each one of the sectors includes a plurality of the first electrodes connected to one of the first pad structures and a plurality of the second electrodes connected to one of the second pad structures.

In example embodiments, the active region may include an upper compound semiconductor layer on a lower compound semiconductor layer, and the lower compound semiconductor layer may include a two dimensional electron gas (2DEG).

In example embodiments, the power device chip may further include: source electrode pads and drain electrode pads arranged interwoven without contacting each other on the active region. In this case, the plurality of unit power devices may include gate electrodes on the active region, the first and second pad structures may be first and second contact pads, the source electrode pads may connect the first electrodes the first contact pads, and the drain electrode pads may connect the second electrodes to the second contact pads. The first electrodes, gate electrodes, and second electrodes may be alternately arranged on the active region and spaced apart from each other.

In example embodiments, each one of the source electrode pads may extend parallel over two of the gate electrodes and one of the first electrodes.

In example embodiments, the power device chip may further include a gate pad, and a pad line connecting the gate pad to a plurality of the gate electrodes.

In example embodiments, the first pad structures and the second pad structures may be on opposite ends of the active region.

In example embodiments, the plurality of unit power devices may include gate electrodes on the active region. The first electrodes, the gate electrodes, and the second electrodes may be alternately arranged on the active region and spaced apart from each other.

In example embodiments, first conductive plugs may connect the first pad structures to the first electrodes, and second conductive plugs may connect the second pad structures to the second electrodes.

In example embodiments, the first pad structures may be over portions of the first electrodes and portions of the second electrodes.

In example embodiments, the first electrodes and the second electrodes may be arranged interwoven without contacting each other on the active region.

According to example embodiments, a method of manufacturing a power device chip includes: forming a first pad layer and a second pad layer on opposite ends of a plurality of unit power devices, the first and second pad layers being spaced apart from each other; classifying the plurality of unit power devices into sectors; diving the first pad layer into first pad layer parts, a number of the first pad layer parts being equal to a number of the sectors; and identifying defective sectors among the sectors by measuring a breakdown voltage of each one of the sectors using the first pad layer parts and the second pad layer, the defective sectors corresponding to a portion of the sectors having a breakdown voltage that is lower than a reference value.

In example embodiments, the defective sectors may be excluded from wire bonding.

In example embodiments, the method may further include: dividing the second pad layer into a plurality of second pad layer parts, wherein a number of the second pad layer parts may be equal to the number of the sectors.

In example embodiments, the plurality of unit devices may include: a lower compound semiconductor layer including a two dimensional electron gas (2DEG); an upper compound semiconductor layer on the lower compound semiconductor layer; and a plurality of a source electrodes, gate electrodes, and drain electrodes alternately arranged and spaced apart from each other on the upper compound semiconductor layer. Each one of the plurality of unit power devices may be defined by one of the gate electrodes between an adjacent one of the source electrodes and an adjacent one of the drain electrodes on corresponding portions of the upper and lower compound semiconductor layers.

In example embodiments, the forming the first pad layer may include forming first electrode pad layers that connect the first pad layer to the plurality of the source electrodes of the plurality of unit power devices; and the forming the second pad layer may include forming second electrode pad layers that connect the second pad layer to the plurality of the drain electrodes of the plurality of unit power devices.

BRIEF DESCRIPTION OF THE DRAWINGS

These and/or other aspects will become apparent and more readily appreciated from the following description of non-limiting embodiments, taken in conjunction with the accompanying drawings in which like reference characters refer to the same or like parts throughout the different views. The drawings are not necessarily to scale, emphasis instead being placed upon illustrating principles of inventive concepts. In the drawings.

DETAILED DESCRIPTION

Figure 1:
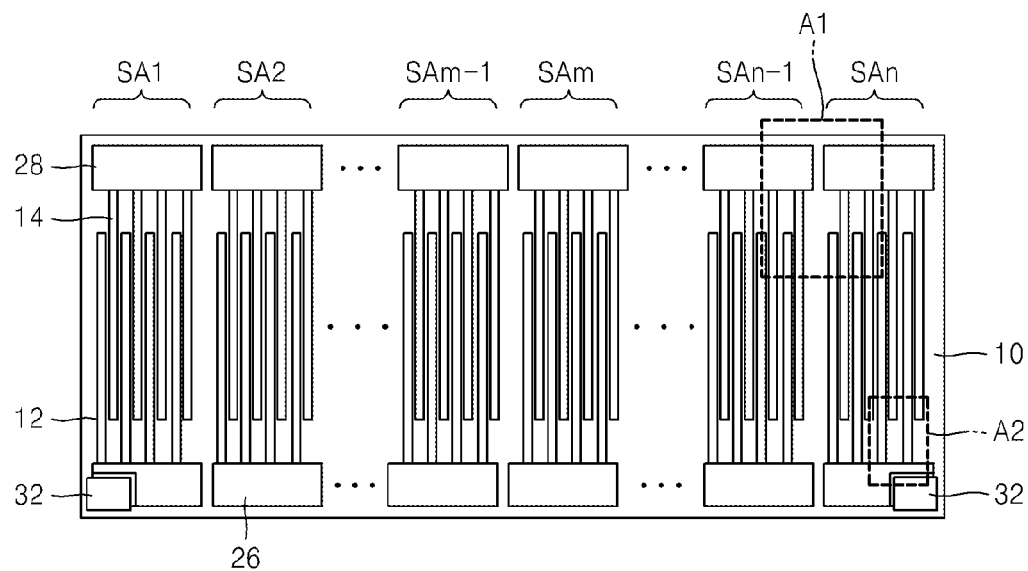
FIG. 1 is a plan view of a power device (e.g., high electron mobility transistor (HEMT) chip according to example embodiments.

Example embodiments will now be described more fully with reference to the accompanying drawings, in which some example embodiments are shown. Example embodiments, may, however, be embodied in many different forms and should not be construed as being limited to the embodiments set forth herein; rather, these example embodiments are provided so that this disclosure will be thorough and complete, and will fully convey the scope of example embodiments of inventive concepts to those of ordinary skill in the art. In the drawings, the thicknesses of layers and regions are exaggerated for clarity. Like reference numerals in the drawings denote like elements, and thus their description may be omitted.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. As used herein, the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections. These elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof. Expressions such as "at least one of," when preceding a list of elements, modify the entire list of elements and do not modify the individual elements of the list.

Example embodiments are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of example embodiments.

Unless otherwise defined, all terms (including technical and scientific terms) used herein have the same meaning as commonly understood by one of ordinary skill in the art to which example embodiments belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

First, a power device chip according to example embodiments will now be described.

Figure 3:
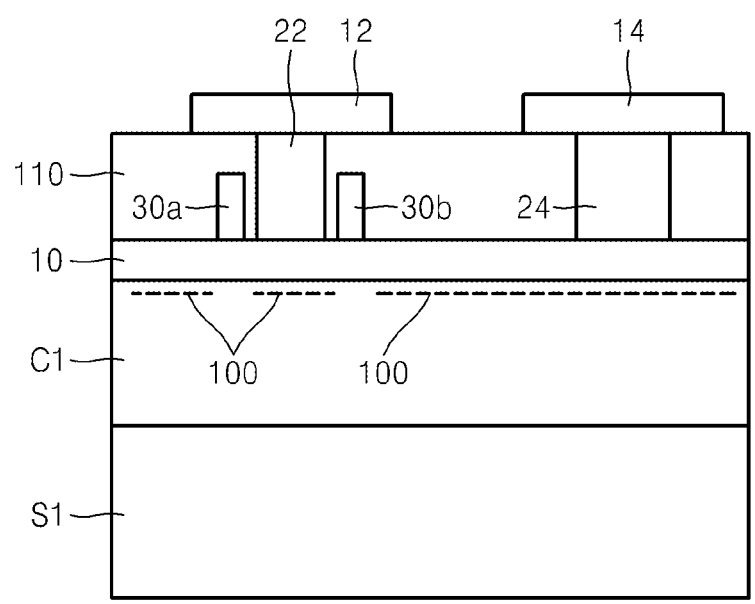
FIG. 3 is a cross-sectional view taken along line 3-3' of FIG. 2.

FIG. 1 is a plan view of a power device chip according to example embodiments. Referring to FIG. 1, a plurality of source electrode pads 12 and a plurality of drain electrode pads 14 exist on an upper compound semiconductor layer 10. The source electrode pads 12 and the drain electrode pads 14 are formed on the upper compound semiconductor layer 10, but may not contact the upper compound semiconductor layer 10. For example as shown in FIG. 3, an interlayer insulating layer 110 may be between the upper compound semiconductor layer 10 and the source electrode pads 12 and the drain electrode pads 14. Also, as will be described later, source electrodes may be disposed between the upper compound semiconductor layer 10 and the source electrode pads 12, and drain electrodes may be disposed between the upper compound semiconductor layer 10 and the drain electrode pads 14. The number of source electrode pads 12 may be identical with the number of drain electrode pads 14. A unit power device may include a single source electrode pad 12 and a single drain electrode pad 14. A single power device chip may include a plurality of unit power devices. The source electrode pads 12 alternate with the drain electrode pads 14 on the upper compound semiconductor layer 10. The source electrode pads 12 and the drain electrode pads 14 are arranged interwoven without contacting each other. The active region of the power device chip may be divided into a plurality of sectors. For example, the upper compound semiconductor layer 10 may be divided into a plurality of sectors SA1, SA2 ... SAm, SA(m−1) ... SA(n−1), and SAn (where m and n denote positive integers). Each sector may include a plurality of unit power devices, and the number of unit power devices included in each sector may be identical. Accordingly, each sector may include an identical number of source electrode pads 12 and an identical number of drain electrode pads 14. The source electrode pads 12 may correspond to source electrodes, respectively, and the drain electrode pads 14 may correspond to drain electrodes, respectively. Accordingly, the numbers of source electrodes and drain electrodes included in each sector may be the same.

A plurality of source contact pads 26 and a plurality of drain contact pads 28 exist together with the source and drain electrode pads 12 and 14 on the upper compound semiconductor layer 10. The source contact pads 26 are spaced from one another. The drain contact pads 28 are also spaced from one another. The number of source contact pads 26 may be identical with the number of drain contact pads 28. The number of drain contact pads 28 may be identical with the number of sectors SA1, SA2 ... SAm, SA(m−1) ... SA(n−1), and SAn. Accordingly, the drain contact pads 28 may correspond to the sectors SA1, SA2 ... SAm, SA(m−1) ... SA(n−1), and SAn, respectively, and the same rule may be applied to the source contact pads 26. A drain contact pad 28 of each sector is connected to drain electrode pads 14 of the sector. A source contact pad 26 of each sector is connected to source electrode pads 12 of the sector. The source contact pads 26 and the drain contact pads 28 may be arranged beside the source and drain electrode pads 12 and 14. Alternatively, the source contact pads 26 and the drain contact pads 28 may be arranged above or below the source and drain electrode pads 12 and 14.

Figure 2:
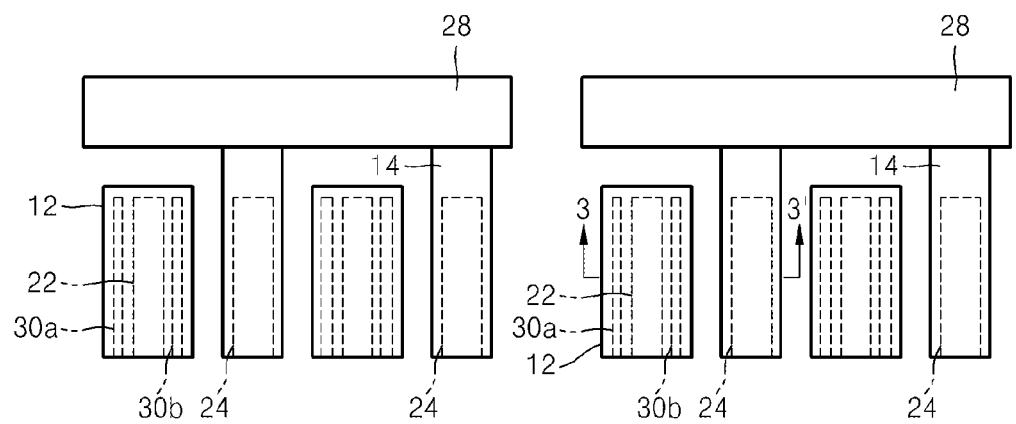
FIG. 2 is a plan view of an enlargement of a first part of the power device chip of FIG. 1.

FIG. 2 is a plan view of an enlargement of a first part A1 of the power device chip of FIG. 1. Referring to FIG. 2, a plurality of drain electrode pads 14 are connected to each drain contact pad 28. The drain contact pads 28 and the drain electrode pads 14 may be formed of an identical material or different materials. The drain contact pads 28 and the drain electrode pads 14 may be formed simultaneously in a single process. The drain contact pads 28 and the drain electrode pads 14 may be collectively called drain pads. A single source electrode pad 12 exists between every two adjacent drain electrode pads 14. Each drain electrode 24 exists below each drain electrode pad 14. The drain electrodes 24 are separated from the drain contact pad 28. A source electrode 22 and first and second gate electrodes 30a and 30b are arranged below each source electrode pad 12. The first and second gate electrodes 30a and 30b exist on both sides of the source electrode 22, respectively. The source electrodes 22 and the first and second gate electrodes 30a and 30b are separated from the drain contact pads 28. The source electrodes 22, the drain electrodes 24, the first gate electrodes 30a, and the second gate electrodes 30b may be arranged in strips.

FIG. 3 is a cross-sectional view taken along line 3-3' of FIG. 2.

Referring to FIG. 3, the source electrode 22 and the drain electrode 24 are separated from each other on the upper compound semiconductor layer 10. The first gate electrode 30a is formed on the left of the source electrode 22. The first gate electrode 30a and the source electrode 22 are separated from each other. The second gate electrode 30b exists on a part of the upper compound semiconductor layer 10 between the source electrode 22 and the drain electrode 24. The second gate electrode 30b is closer to the source electrode 22 than to the drain electrode 24. The first and second gate electrodes 30a and 30b may be vertically symmetrical about the source electrode 22. The source electrodes 22 may be higher than the first and second gate electrodes 30a and 30b. The first and second gate electrodes 30a and 30b may have the same heights or different heights. An interlayer insulation layer 110 exists between the source electrode 22, the drain electrode 24, the first gate electrode 30a, and the second gate electrode 30b. The interlayer insulation layer 110 may be formed of a typical interlayer insulation material that is used for semiconductor devices. The first and second gate electrodes 30a and 30b are covered with the interlayer insulation layer 110. Lateral sides of the source electrode 22 and the drain electrode 24 are covered with the interlayer insulation layer 110. The source electrode pad 12, which covers an upper surface of the source electrode 22, and the drain electrode pad 14, which covers an upper surface of the drain electrode 24, exist on the interlayer insulation layer 110. The source electrode pad 12 may be wider than the source electrode 22. The first and second gate electrodes 30a and 30b may be located below the source electrode pad 12. The drain electrode pad 14 may be wider than the drain electrode 24. The source electrode pad 12 and the drain electrode pad 14 may be arranged side-by-side.

Various shape variation, layer addition, or a partial change in a layer for a normal off-operation may occur between the first and second gate electrodes 30a and 30b and the upper compound semiconductor layer 10. A lower compound semiconductor layer C1, including 2-dimensional electron gases (2DEGs) 100 may exist below the upper compound semiconductor layer 10. The lower compound semiconductor layer C1 is formed on a substrate S1. The upper compound semiconductor layer 10 may be configured to induce the 2DEGs in the lower compound semiconductor layer C1. Since the lower compound semiconductor layer C1, including the 2DEGs 100, is well known in the field of power device chips, for example, high electron mobility transistor (HEMT) chips, it will not be described herein.

Figure 4A:
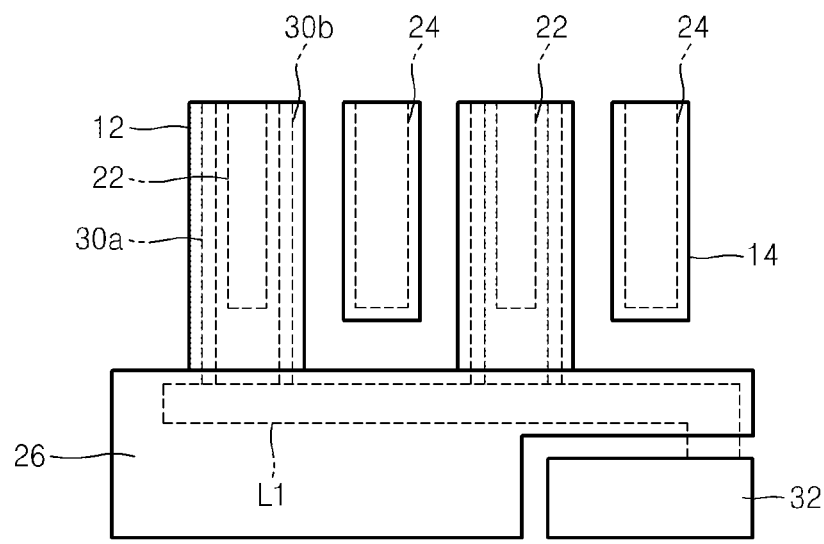
FIGS. 4A and 4B are plan views of an enlargement of a second part of the power device chip of FIG. 1.

FIG. 4A is a plan view of an enlargement of a second part A2 of the power device chip of FIG. 1. Referring to FIG. 4A, the first and second gate electrodes 30a and 30b pass below the source contact pad 26 and are connected to a gate pad 32 via a pad line L1. The first and second gate electrodes 30a and 30b, the gate pad 32, and the pad line L1 do not contact the source contact pad 26. The source electrodes 22 are separated from the source contact pad 26. The source electrode pads 12 are connected to the source contact pad 26. The source contact pads 26 and the source electrode pads 12 may be collectively called source pads. The source contact pads 26 and the source electrode pads 12 may be formed of an identical material or different materials. The source contact pads 26 and the source electrode pads 12 may be formed simultaneously in an identical process. A single drain electrode pad 14 exists between every two adjacent source electrode pads 12. The drain electrode pads 14 are separated from the source contact pad 26.

Figure 4B:
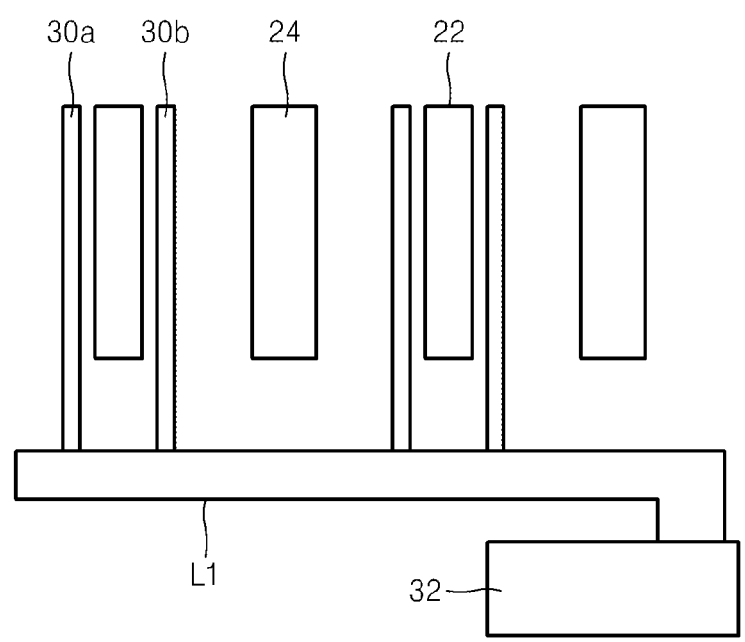

FIG. 4B is a plan view of a resultant structure obtained by removing the source electrode pads 12, the drain electrode pads 14, and the source contact pad 26 from the power source chip of FIG. 4A. Referring to FIG. 4B, a position relationship among the source electrode 22, the drain electrode 24, and the first and second gate electrodes 30a and 30b is more clearly seen. Connections between the first and second gate electrodes 30a and 30b, the pad line L1, and the gate pad 32 is also more clearly seen.

Figure 5:
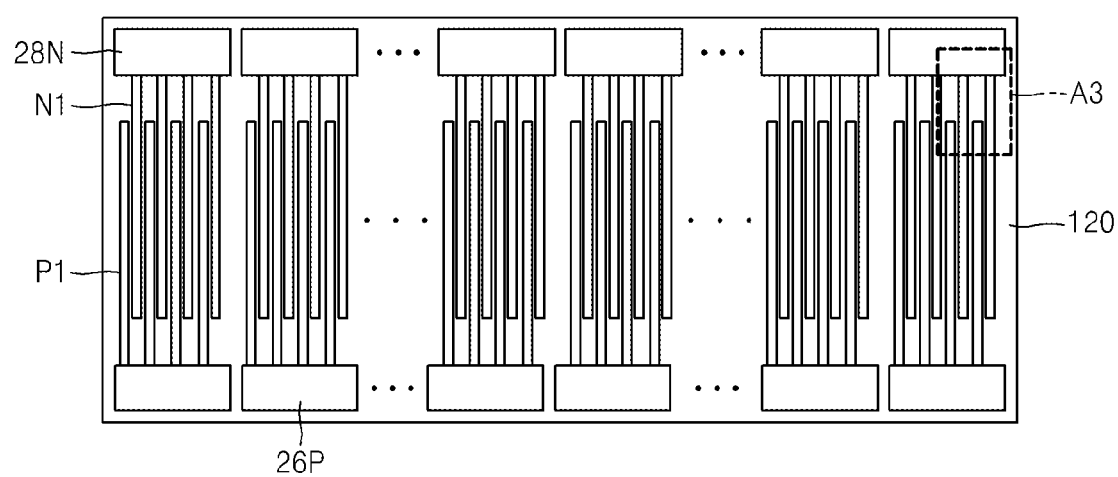
FIG. 5 is a plan view of a power device (e.g., diode) chip according to example embodiments.

FIG. 5 is a plan view of a power device chip, namely, a power diode chip, according to example embodiments. Referring to FIG. 5, a plurality of first electrodes P1 and a plurality of second electrodes N1 are arranged on a lower layer 120. The arrangement of the first and second electrodes P1 and N1 may be the same as that of the source electrodes 22 and the drain electrode 24 of FIG. 1, and the first and second electrodes P1 and N1 may be divided into the sectors SA1, SA2, . . . SAm−1, SAm, . . . SAn−1, and SAn as described above with respect to FIG. 1. The number of first electrode pads 26P arranged on the lower layer 120 is equal to the number of sectors, and the number of second electrode pads 28N also arranged on the lower layer 120 is equal to the number of sectors. The first and second electrode pads 26P and 28N face each other with the first and second electrodes P1 and N1 interposed therebetween. Each sector includes a plurality of first electrodes P1 and a plurality of second electrodes N1. In each sector, the first electrodes P1 are connected to a first electrode pad 26P corresponding to the sector, and the second electrodes N1 are connected to a second electrode pad 28N corresponding to the sector.

Figure 6:
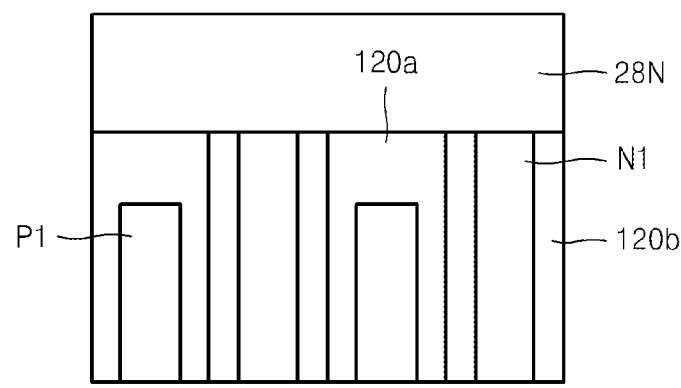
FIG. 6 is a plan view of an enlargement of a third part of the power device chip of FIG. 5.

Referring to FIG. 6, which is a magnified view of a part A3 of FIG. 5, the lower layer 120 includes a first lower layer 120a and a second lower layer 120b. The first electrodes P1 are arranged on the first lower layer 120a, and the second electrodes N1 are arranged on the second lower layer 120b. One of the first lower layer 120a and the second lower layer 120b may be a P-type semiconductor layer, and the other may be an N-type semiconductor layer. Accordingly, the first lower layer 120a may be a P-type semiconductor layer, and the first electrode P1 may be a P-type electrode of a diode. In this case, the semiconductor layer may be a compound semiconductor layer.

A diode described with reference to FIGS. 5 and 6 may be a Schottky diode. However, example embodiments are not limited thereto.

Figure 7:
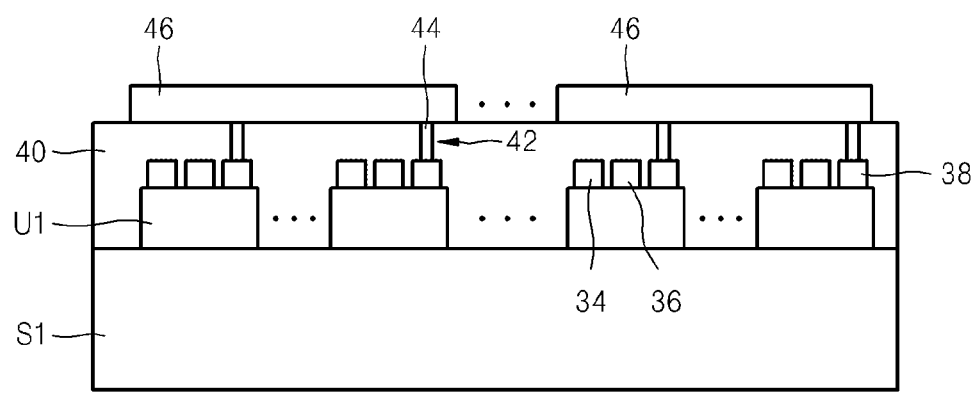
FIG. 7 is a cross-sectional view of a power device (e.g., an HEMT) chip according to example embodiments taken in a length direction of a drain pad.

FIG. 7 illustrates a power device chip (e.g., an HEMT chip) according to example embodiments. FIG. 7 illustrates the case where a drain pad is arranged on a drain electrode. Referring to FIG. 7, a plurality of unit power devices U1 exist on a substrate S1. Reference numerals 34, 36, and 38 may denote a source electrode, a gate electrode, and a drain electrode, respectively, of each unit power device U1. The unit power devices U1 are covered with an interlayer insulation layer 40. First via holes 42, via which the drain electrodes 38 are exposed, are formed in the interlayer insulation layer 40 having a flat surface. The first via holes 42 are respectively filled with conductive plugs 44. A plurality of drain pads 46, which are separated from one another and contact the conductive plugs 44, exist on the interlayer insulation layer 40. The drain pads 46 are used for wire bonding. A plurality of unit power devices U1 are connected to each drain pad 46. The unit power devices U1 connected to each drain pad 46 constitute a sector.

Figure 8:
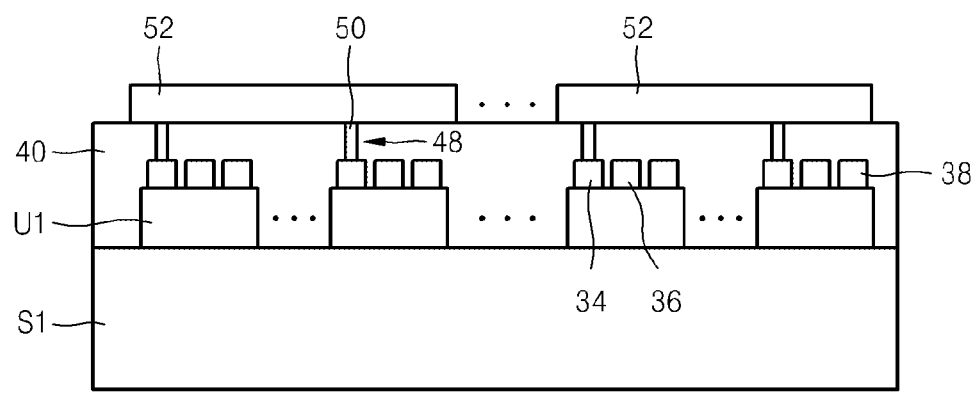
FIG. 8 is a cross-sectional view of the power device chip of FIG. 7 taken in a length direction of a source pad.

FIG. 8 illustrates a power device chip according to example embodiments. FIGS. 7 and 8 illustrate cross-sections of the same power device chip at different locations. FIG. 8 is a cross-sectional view taken in the length direction of source pads 52. Only parts of FIG. 8 that are different from FIG. 7 will now be described.

Referring to FIG. 8, second via holes 48, via which the source electrodes 34 of the unit power devices U1 are exposed, are formed in the interlayer insulation layer 40. The second via holes 48 are respectively filled with conductive plugs 50. The conductive plugs 50 that fill the second via holes 48 may be the same as the conductive plugs 44, which fill the first via holes 42 of FIG. 7. A plurality of source pads 52, which contact the conductive plug 50, exist on the interlayer insulation layer 40. The source pads 52 correspond to a plurality of sectors. A plurality of unit power devices U1 are connected to each source pad 52.

Figure 9:
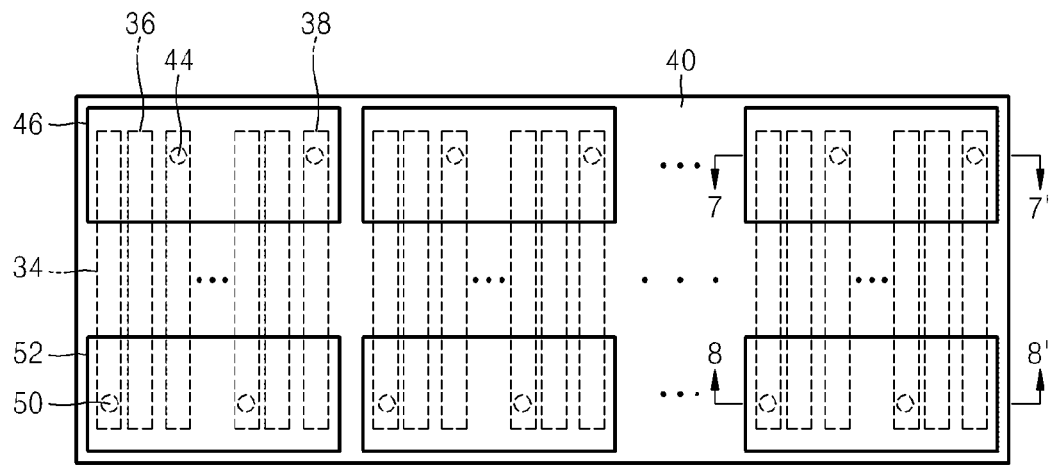
FIG. 9 is a plan view of a power device chip having the cross-sections of FIGS. 7 and 8.

FIG. 9 is a plan view of a power device chip having the cross-sections of FIGS. 7 and 8. The cross-section of FIG. 7 corresponds to a cross-section taken along line 7-7' of FIG. 9, and the cross-section of FIG. 8 corresponds to a cross-section taken along line 8-8' of FIG. 9.

Referring to FIG. 9, the source electrode 34, the gate electrode 36, and the drain electrode 38 are arranged in strips. The source pads 52 cover one of the ends of the source electrodes 34, the gate electrodes 36, and the drain electrodes 38, and the drain pads 46 cover the other ends of the source electrodes 34, the gate electrodes 36, and the drain electrodes 38. Each source pad 52 corresponding to a sector is connected to a plurality of source electrodes 34 included in the sector, via the conductive plugs 50. Each drain pad 46 corresponding to a sector is connected to a plurality of drain electrodes 38 included in the sector, via the conductive plugs 44. Gate pads connected to the gate electrodes 36 may be formed on the interlayer insulation layer 40, but they are not shown for convenience of explanation.

Figure 10:
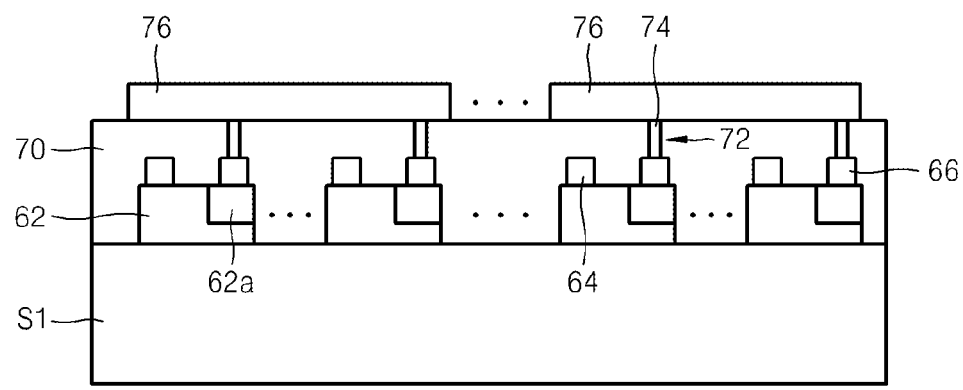
FIG. 10 is a cross-sectional view of a power device (e.g., diode) chip according to example embodiments taken in a length direction of a selected electrode pad.

FIG. 10 illustrates a power device chip (e.g., a diode chip) according to example embodiments. Referring to FIG. 10, a plurality of unit power devices (e.g., diodes) each including a first semiconductor layer 62 and a second semiconductor layer 62a exist on a substrate 51. The first semiconductor layer 62 may be a P-type or N-type semiconductor layer, for example, a group III-V compound semiconductor layer. The second semiconductor layer 62a may be of an opposite type to the type of the first semiconductor layer 62. Accordingly, the first and second semiconductor layers 62 and 62a may form a PN junction. A third electrode 64 is formed on the first semiconductor layer 62. When the first semiconductor layer 62 is a P-type semiconductor layer, the third electrode 64 may be a P-type electrode. A fourth electrode 66 is formed on the second semiconductor layer 62a. The fourth electrode 66 may be of an opposite type to the type of the third electrode 64. Accordingly, when the third electrode 64 is a P-type electrode, the fourth electrode 66 may be an N-type electrode. The first and second semiconductor layers 62 and 62a and the third and fourth electrodes 64 and 66 are covered with an interlayer insulation layer 70. The interlayer insulation layer 70 includes third via holes 72, via which the fourth electrodes 66 are exposed. The third via holes 72 are respectively filled with conductive plugs 74. A plurality of third electrode pads 76, which contact the conductive plugs 74, exist on the interlayer insulation layer 70. The third electrode pads 76 are spaced from one another. A plurality of unit power devices correspond to each third electrode pad 76. A single sector corresponds to each third electrode pad 76.

Figure 11:
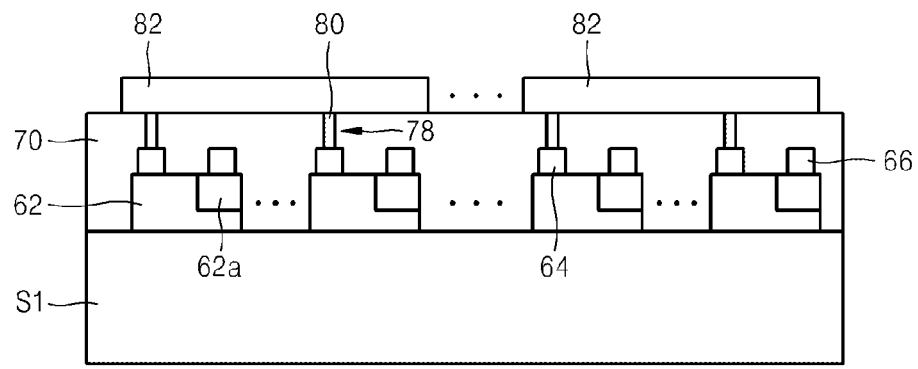
FIG. 11 is a cross-sectional view of the power device chip of FIG. 10 taken in a length direction of another electrode pad.

FIG. 11 illustrates a power device chip according to example embodiments. The cross-sections of FIGS. 10 and 11 are of same power diode chip at different locations. Only parts of FIG. 11 that are different from FIG. 10 will now be described.

Referring to FIG. 11, fourth via holes 78, via which the third electrodes 64 are exposed, are formed in the interlayer insulation layer 70. The fourth via holes 78 are respectively filled with conductive plugs 80. Fourth electrode pads 82, which cover the fourth via holes 78 and contact the conductive plugs 80, exist on the interlayer insulation layer 70. Wire bonding or flip chip bonding may be performed on the fourth electrode pads 82. Wire bonding or flip chip bonding may also be performed on the third electrode pads 76.

Figure 12:
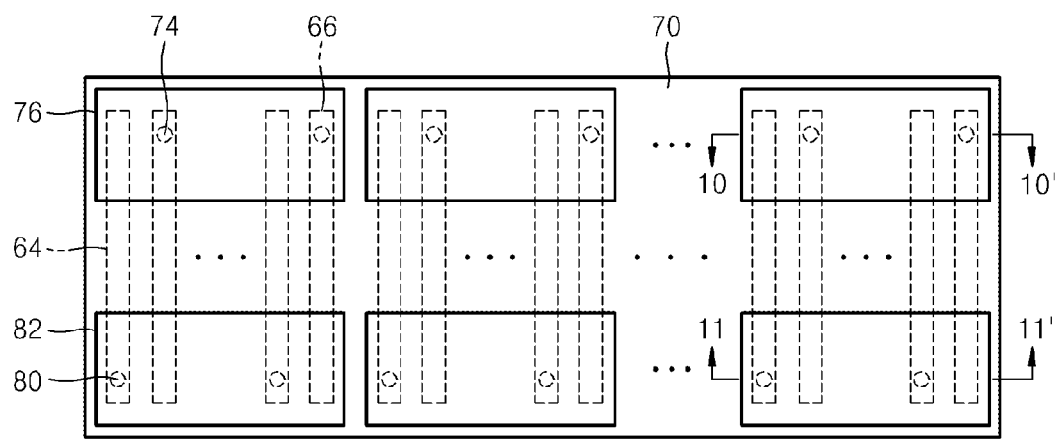
FIG. 12 is a plan view of a power device chip having the cross-sections of FIGS. 10 and 11.

FIG. 12 is a plan view of a power diode chip having the cross-sections of FIGS. 10 and 11. The cross-section of FIG. 10 corresponds to a cross-section taken along line 10-10' of FIG. 12, and the cross-section of FIG. 11 corresponds to a cross-section taken along line 11-11' of FIG. 12.

Referring to FIG. 12, the third and fourth electrodes 64 and 66 are arranged in strips. The third and fourth electrode pads 76 and 82 are each arranged side-by-side, and are perpendicular to the third and fourth electrodes 64 and 66. The third electrode pads 76 cover one of the ends of the third and fourth electrodes 64 and 66, and the fourth electrode pads 82 cover the other ends of the third and fourth electrodes 64 and 66.

Figure 13:
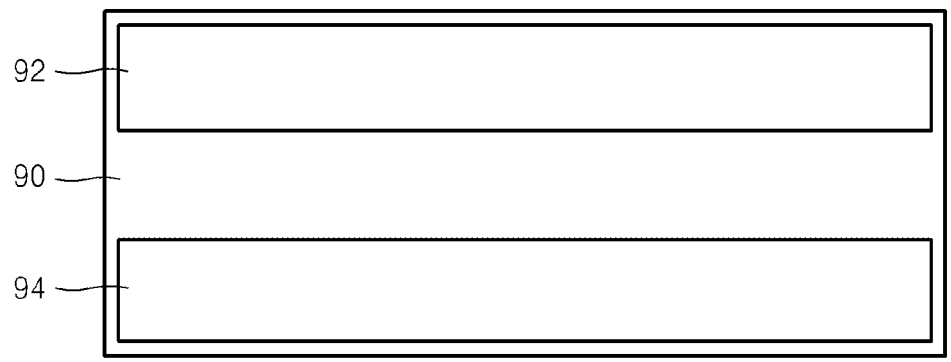
FIGS. 13-15 are plan views illustrating a method of manufacturing a power device chip, according to example embodiments.
Figure 14:
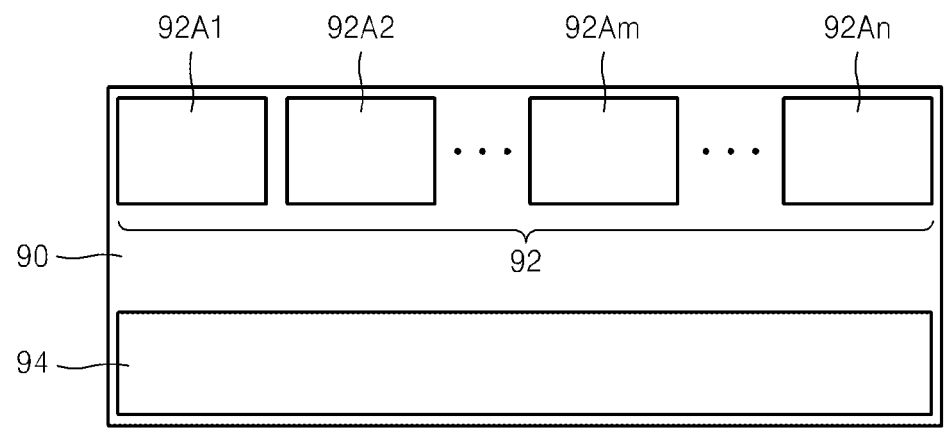
Figure 15:
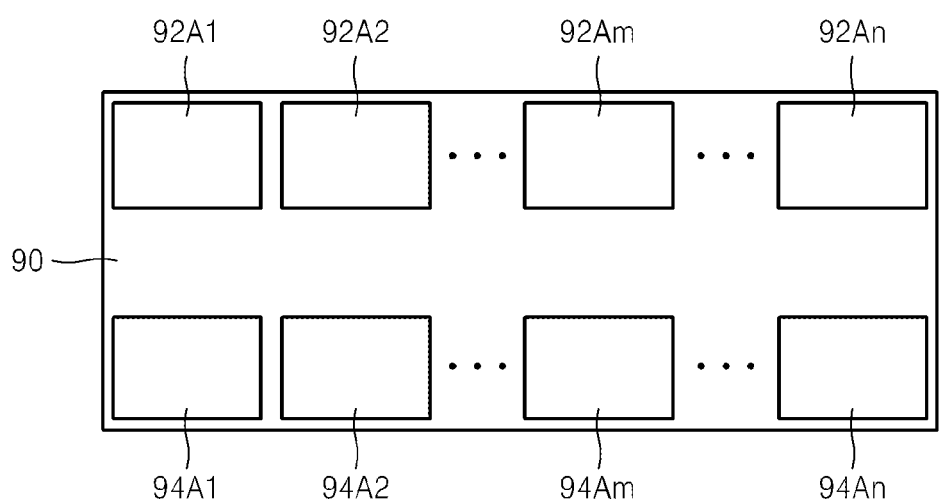

FIGS. 13-15 illustrate a method of manufacturing a power device chip, according to example embodiments.

Referring to FIG. 13, first and second pad layers 92 and 94 are formed on a lower layer 90. The first and second pad layers 92 and 94 are separated from each other and are parallel to each other. The lower layer 90 may include a plurality of unit power devices. The plurality of unit power devices may be divided into a plurality of sectors. Considering the defect density of a wafer on which the power device chip is formed, the plurality of unit power devices may be divided so that extra sectors are further included. For example, in a power device chip suitable for a current of 100 A or greater, the plurality of unit power devices are divided into 10 sectors, and a current of 10 A may flow in each sector. However, if the probability of generating defective sectors is about 30% considering a wafer defect density, the plurality of unit power devices may be divided into 13 sectors that include 3 extra sectors that can replace the defective sectors.

The plurality of unit power devices divided into sectors may be connected to the first and second pad layers 92 and 94. When each unit power device includes a source electrode, a drain electrode, and a gate electrode, the lower layer 90 may be a compound semiconductor layer or an interlayer insulation layer. If the unit power device does not include a gate electrode, for example, in the case of a power diode, the lower layer 90 may include a P-type semiconductor layer having an electrode contact surface and an N-type semiconductor layer having an electrode contact surface. In this case, the first pad layer 92 may be formed on one of the P-type semiconductor layer and the N-type semiconductor layer, and the second pad layer 94 may be formed on the other semiconductor layer.

Referring to FIG. 14, the first pad layer 92 may be divided into a plurality of pad layers 92A1, 92A2 . . . 92Am, to 92An (where m and n denote positive integers). The first pad layer 92 may be divided into the same number of pad layers as the number of sectors. The first pad layer 92 may be a drain pad. The second pad layer 94 may not be divided. However, as illustrated in FIG. 15, the second pad layer 94 may be divided into a plurality of pad layers 94A1, 94A2 . . . 94Am, to 94An, the number of which is equal to the number of pad layers into which the first pad layer 92 is divided.

Detection of defective sectors and bonding of sectors, except the defective sectors, will now be described with reference to FIG. 14. A breakdown voltage (BV) of each sector is measured according to an electrical measuring method that uses a probe card and a switching matrix. In other words, a BV between each of the pad layers 92A1, 92A2 . . . 92Am, to 92An respectively connected to the sectors and the second pad layer 94 is measured. Since this measurement may be automatically performed on a wafer level, the time taken to perform the measurement may be reduced. From the BV measurement, defective sectors of which BVs are less than or equal to a predetermined value may be ascertained, and it may be known which pad layers from among the pad layers 92A1, 92A2 . . . 92Am, to 92An are connected to the defective sectors. For example, if BVs measured from a second pad layer 92A2 and an m-th pad layer 92Am are lower than a predetermined value (e.g., a reference value), sectors connected to the second pad layer 92A2 and the m-th pad layer 92Am may be considered as defective sectors.

A sector map that shows a distribution of normal sectors and defective sectors may be created using such a measurement result and may be input to a wire bonding apparatus. Thus, pad layers connected to the defective sectors may be automatically excluded from wire bonding. Accordingly, the yield of the power device chip may be increased, and the use of defective sectors may be prevented due to exclusion of the defective sectors from wiring bonding. Consequently, a cutting process is not required.

A method of manufacturing the power device chip of FIG. 3, according to example embodiments, will now be described with reference to FIGS. 16-18.

Figure 16:
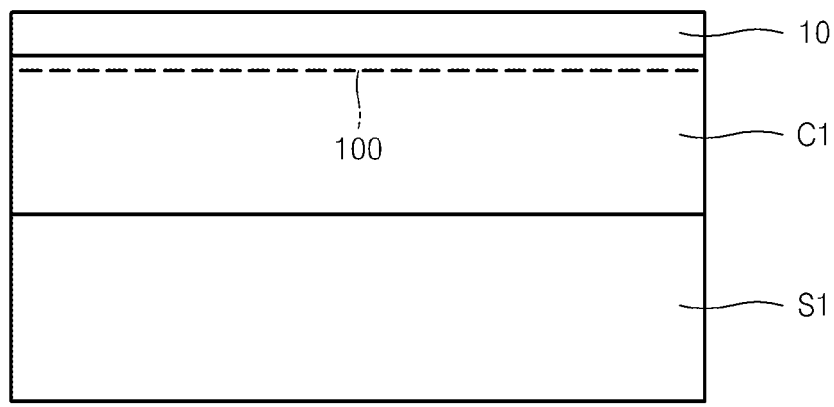
FIGS. 16-18 are cross-sectional views illustrating a method of manufacturing the power device chip illustrated in FIG. 3, according to example embodiments.

Referring to FIG. 16, the lower compound semiconductor layer C1 is formed on the substrate S1. The lower compound semiconductor layer C1 may include a plurality of layers. The plurality of layers may include at least one compound semiconductor layer. The lower compound semiconductor layer C1 may include, for example, a group III-V compound semiconductor layer. The upper compound semiconductor layer 10 is formed on the lower compound semiconductor layer C1. The upper compound semiconductor layer 10 may have a different bandgap from the lower compound semiconductor layer C1. The upper compound semiconductor layer 10 may have a larger bandgap than the lower compound semiconductor layer C1. Accordingly, while the upper compound semiconductor layer 10 is being formed, the 2DEGs 100 appear in the lower compound semiconductor layer C1. The 2DEGs 100 may be distributed under the interface between the upper and lower compound semiconductor layers 10 and C1.

Figure 17:
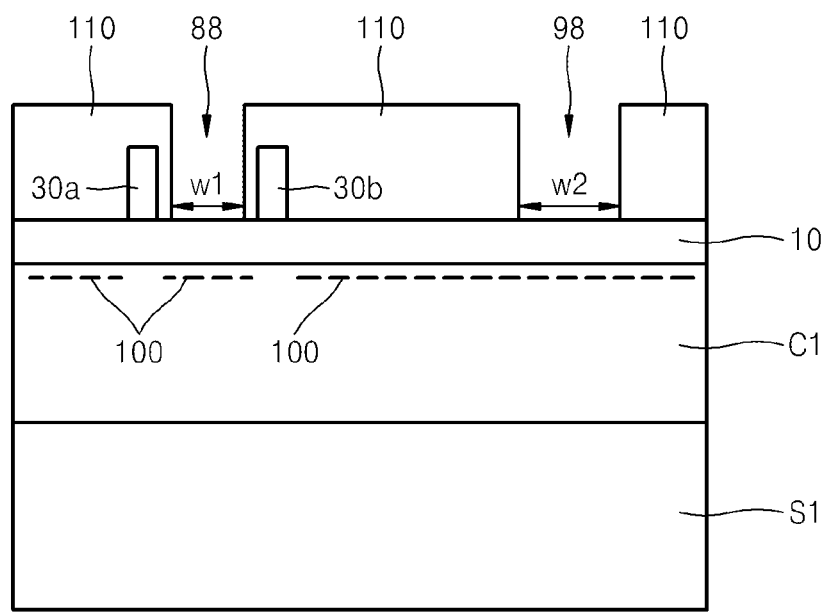
Figure 18:
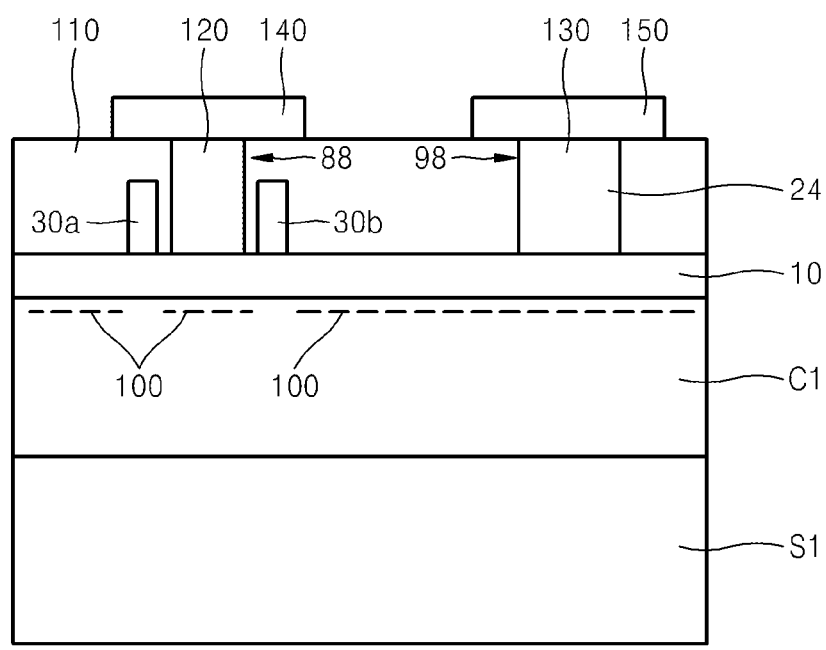

Referring to FIG. 17, the first and second gate electrodes 30a and 30b are formed separately on the upper compound semiconductor layer 10. A source electrode is formed between the first and second gate electrodes 30a and 30b in a subsequent process. Thus, when the first and second gate electrodes 30a and 30b are formed, the first and second gate electrodes 30a and 30b are spaced from each other by an optimal distance in order to interpose the source electrode therebetween. The first and second gate electrodes 30a and 30b may have the same heights or different heights. The first and second gate electrodes 30a and 30b may be formed of a material used to form a gate electrode included in a typical power device, but the material of the first and second gate electrodes 30a and 30b is not limited thereto. While the first and second gate electrodes 30a and 30b are being formed, parts of the lower compound semiconductor layer C1 that face the first and second gate electrodes 30a and 30b turn into depletion regions. Accordingly, 2DEGs may disappear from the regions of the lower compound semiconductor layer C1 that face the first and second gate electrodes 30a and 30b, or the regions of the lower compound semiconductor layer C1 that face the first and second gate electrodes 30a and 30b may have lower electron densities than the other regions. In this case, the first and second gate electrodes 30a and 30b may be p-type electrodes. To form the depletion regions in the lower compound semiconductor layer C1, a depletion layer may be further formed between the first and second gate electrodes 30a and 30b and the upper compound semiconductor layer 10. Alternatively, to form the depletion regions in the lower compound semiconductor layer C1, a recess may be formed in the upper compound semiconductor layer 10 or a predetermined region of the upper compound semiconductor layer 10 may be oxidized.

Next, the interlayer insulation layer 110 is formed on the upper compound semiconductor layer 10 in order to cover the first and second gate electrodes 30a and 30b. Then, a fifth via hole 88 and a sixth via hole 98 are formed in the interlayer insulation layer 110. The fifth via hole 88 is separated from the sixth via hole 98. The fifth via hole 88 is formed between the first and second gate electrodes 30a and 30b. The sixth via hole 98 may be formed on the right of the second gate electrode 30b. A width W1 of the fifth via hole 88 and a width W2 of the sixth via hole 98 may be identical or different. The width W2 of the sixth via hole 98 may be greater than the width W1 of the fifth via hole 88. The fifth and sixth via holes 88 and 98 may be formed according to a photolithography process using a mask. Referring to FIG. 18, the fifth via hole 88 of the interlayer insulation layer 110 is filled with a first conductive material 120, and the sixth via hole 98 is filled with a second conductive material 130. The first and second conductive materials 120 and 130 may be the same and may be formed simultaneously. The first conductive material 120 may form the source electrode 22 of FIG. 3. The second conductive material 130 may form the drain electrode 24 of FIG. 3. A first electrode pad layer 140, covering the first conductive material 120, and a second electrode pad layer 150, covering the second conductive material 130, are formed on the interlayer insulation layer 110. The first and second electrode pad layers 140 and 150 are spaced from each other. The first electrode pad layer 140 may be used as the source electrode pad 12 of FIG. 3. The second electrode pad layer 150 may be used as the drain electrode pad 14 of FIG. 3. The widths of the first and second electrode pad layers 140 and 150 may be identical or different.

It should be understood that example embodiments described herein should be considered in a descriptive sense only and not for purposes of limitation. Descriptions of features or aspects within each power device chip according to example embodiment should typically be considered as available for other similar features or aspects in other power device chips according to example embodiments. While some example embodiments have been particularly shown and described, it will be understood by one of ordinary skill in the art that variations in form and detail may be made therein without departing from the spirit and scope of the claims.

What is claimed is:

1. A power device chip comprising:
a plurality of unit power devices classified into a plurality of sectors;
a first pad divided into first pad parts; and
a second pad divided into second pad parts,
a number of the first pad parts being equal to a number of the plurality of sectors,
a number of the second pad parts being equal to the number of the plurality of sectors,
the first pad parts being connected to first electrodes of the plurality of unit power devices,
the second pad parts being connected to second electrodes of the plurality of unit power devices, and
a number of the first electrodes electrically connected to a corresponding one of the first pad parts is equal to a number of the second electrodes connected to a corresponding one of the second pad parts, wherein
the plurality of unit power devices share an active region in common, and
each one of the sectors is defined by a portion of the active region that is between only one of the first pad parts and only one of the second pad parts.

2. The power device chip of claim 1, wherein the unit power devices are diodes.

3. The power device chip of claim 1, further comprising:
third electrodes in the plurality of unit power devices; and
a third pad connected to the third electrodes.

4. The power device chip of claim 3, wherein the unit power devices are high electron mobility transistors (HEMTs).

5. The power device chip of claim 3, wherein
the first electrodes are source electrodes,
the third electrodes are gate electrodes,
the gate electrodes include first and second gate electrodes respectively arranged adjacent to opposite sides of the source electrodes.

6. The power device chip of claim 3, wherein the first, second, and third pads are arranged beside or above the plurality of unit power devices.

7. The power device chip of claim 3, wherein
the first pad parts are source pads, and
the source pads include
source electrode pads that contact the first electrodes, and
source contact pads connected to the source electrode pads.

8. The power device chip of claim 3, wherein
the second pad parts are drain pads, and
the drain pads include
drain electrode pads that contact the second electrodes, and
drain contact pads connected to the drain electrode pads.

9. The power device chip of claim 1, wherein the first and second pads are arranged beside or above the plurality of unit power devices.

10. A power device chip comprising:
an active region of a plurality of unit power devices,
the plurality of unit power devices including first and second electrodes spaced apart from each other on the active region;
first and second pad structures defining sectors of the active region,
the first and second pad structures being first and second contact pads,
each one of the sectors including a plurality of the first electrodes connected to one of the first pad structures and a plurality of the second electrodes connected to one of the second pad structures;
source electrode pads electrically connecting the first electrodes to the first contact pads; and
drain electrode pads electrically connecting the second electrodes to the second contact pads, wherein a number of the first electrodes electrically connected to a corresponding one of the first contact pads is equal to a number of the second electrodes connected to a corresponding one of the second contact pads.

11. The power device chip of claim 10, wherein
the active region includes an upper compound semiconductor layer on a lower compound semiconductor layer, and
the lower compound semiconductor layer includes a two dimensional electron gas (2DEG).

12. The power device chip of claim 10, wherein
the source electrode pads and drain electrode pads are arranged interwoven without contacting each other on the active region,
the plurality of unit power devices include gate electrodes on the active region, and
the first electrodes, gate electrodes, and second electrodes are alternately arranged on the active region and spaced apart from each other.

13. The power device chip of claim 12, wherein each one of the source electrode pads extends parallel over two of the gate electrodes and one of the first electrodes.

14. The power device chip of claim 13, further comprising:
a gate pad; and
a pad line connecting the gate pad to a plurality of the gate electrodes.

15. The power device chip of claim 10, wherein the first pad structures and the second pad structures are on opposite ends of the active region.

16. The power device chip of claim 15, wherein
the plurality of unit power devices include gate electrodes on the active region,
the first electrodes, the gate electrodes, and the second electrodes are alternately arranged on the active region and spaced apart from each other.

17. The power device chip of claim 15, further comprising:
first conductive plugs connecting the first pad structures to the first electrodes; and
second conductive plugs connecting the second pad structures to the second electrodes.

18. The power device chip of claim 15, wherein
the first pad structures are over portions of the first electrodes and portions of the second electrodes.

19. The power device chip of claim 10, wherein the first electrodes and the second electrodes are arranged interwoven without contacting each other on the active region.

20. The power device chip of claim 10, wherein
each one of the sectors is defined by a portion of the active region between only one of the first pad structures and only one of the second pad structures.

* * * * *